US009343582B2

(12) United States Patent
Lee

(10) Patent No.: US 9,343,582 B2
(45) Date of Patent: May 17, 2016

(54) MANUFACTURING METHOD OF THIN FILM TRANSISTOR SUBSTRATE

(71) Applicants: INNOCOM TECHNOLOGY(SHENZHEN) CO., LTD., Longhua Town, Bao An District, Shenzhen (CN); InnoLux Corporation, Miao-Li County (TW)

(72) Inventor: Kuan-Feng Lee, Miao-Li County (TW)

(73) Assignees: INNOCOM TECHNOLOGY (SHENZHEN) CO., LTD., Longhua Town, Guangdong Province (CN); INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/675,973

(22) Filed: Apr. 1, 2015

(65) Prior Publication Data
US 2015/0206980 A1    Jul. 23, 2015

Related U.S. Application Data

(63) Continuation of application No. 13/722,570, filed on Dec. 20, 2012, now Pat. No. 9,024,318.

(30) Foreign Application Priority Data

Dec. 22, 2011 (TW) .............................. 100147908 A

(51) Int. Cl.
H01L 31/20 (2006.01)
H01L 29/04 (2006.01)
(Continued)

(52) U.S. Cl.
CPC ........ H01L 29/7869 (2013.01); H01L 21/0274 (2013.01); H01L 29/66742 (2013.01); H01L 29/66969 (2013.01); H01L 29/786 (2013.01); H01L 29/66765 (2013.01)

(58) Field of Classification Search
CPC ..................... H01L 29/7869; H01L 29/66969; H01L 29/4908; H01L 29/42384
USPC ............................................ 257/57; 438/158
See application file for complete search history.

(56) References Cited

U.S. PATENT DOCUMENTS 5,605,847 A * 2/1997 Zhang ........................... 438/164
2008/0136990 A1 6/2008 Kimura
(Continued)

FOREIGN PATENT DOCUMENTS

CN   101625977   1/2010
TW   511147      11/2002
(Continued)

OTHER PUBLICATIONS

Office Action dated Apr. 14, 2014, from corresponding application No. TW 100147908.
(Continued)

*Primary Examiner* — Theresa T Doan
(74) *Attorney, Agent, or Firm* — McClure, Qualey & Rodack, LLP

(57) ABSTRACT

An embodiment of the invention provides a manufacturing method of a thin film transistor substrate including: sequentially forming a gate electrode, a gate insulating layer covering the gate electrode, an active material layer, and a photosensitive material layer on a first substrate; performing a photolithography process by using a half tone mask to form a photo-sensitive protective layer which is above the gate electrode and has a first recess and a second recess; etching the active material layer by using the photo-sensitive protective layer as a mask to form an active layer; removing a portion of the photo-sensitive protective layer at bottoms of the first recess and the second recess to expose a first portion and a second portion of the active layer respectively; forming a first electrode connecting to the first portion; and forming a second electrode connecting to the second portion.

15 Claims, 11 Drawing Sheets

Figure 1A:
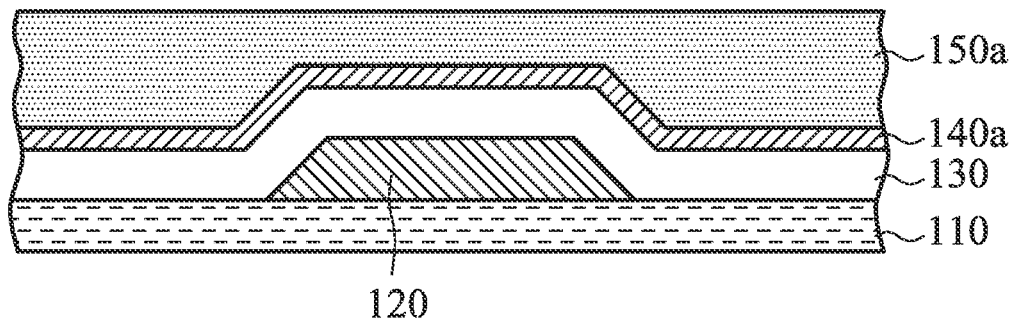

(51) Int. Cl.
*H01L 29/786* (2006.01)
*H01L 29/66* (2006.01)
*H01L 21/027* (2006.01)

(56) References Cited

U.S. PATENT DOCUMENTS

2008/0303020 A1* 12/2008 Shin et al. .................. 257/43
2011/0163310 A1 7/2011 Park et al.

FOREIGN PATENT DOCUMENTS

| TW | 200408131 | 5/2004 |
| TW | 201034204 | 9/2010 |
| TW | 201133643 | 10/2011 |

OTHER PUBLICATIONS

Office Action dated Aug. 6, 2014, from corresponding application No. CN 201110434574.6.

* cited by examiner

MANUFACTURING METHOD OF THIN FILM TRANSISTOR SUBSTRATE

CROSS REFERENCE TO RELATED APPLICATIONS

This application is a Continuation of pending U.S. patent application Ser. No. 13/722,570, filed on Dec. 20, 2012, and entitled "Thin film transistor substrate, manufacturing method thereof, and display", which claims priority of Taiwan Patent Application No. 100147908, filed on Dec. 22, 2011, the entirety of which is incorporated by reference herein.

BACKGROUND

1. Field

The present invention relates to a thin film transistor substrate, and in particular relates to a bottom gate thin film transistor substrate.

2. Description of the Related Art

As display technology progressively develops, everyday life conveniences for people increase, due to the multitude of displays available. Light and thin features are desired for displays. Thus, flat panel displays (FPD) are now the most popular type of displays desired. There are many kinds of FPDs provided, among which liquid crystal displays (LCD) are popular among consumers because of the advantages such as efficient space utilization, low power consumption, no radiance, and low electromagnetic interference (EMI).

Liquid crystal displays are mainly formed by a thin film transistor substrate, a color filter substrate and a liquid crystal layer therebetween. The thin film transistor substrate has a plurality of bottom gate thin film transistors.

In the related art, the manufacturing process of the bottom gate thin film transistor easily suffers from some problems. For example, the forming of a source electrode and a drain electrode may easily damage an active layer therebelow, which results in back channel damage.

BRIEF SUMMARY

An embodiment of the invention provides a manufacturing method of a thin film transistor substrate, which includes: providing a first substrate; forming a gate electrode on the first substrate; forming a gate insulating layer covering the gate electrode on the first substrate; forming an active material layer on the gate insulating layer; forming a photo-sensitive material layer on the active material layer; performing a photolithography process on the photo-sensitive material layer by using a half tone mask to pattern the photo-sensitive material layer so as to form a photo-sensitive protective layer, wherein the photo-sensitive protective layer is above the gate electrode and has a first recess and a second recess which do not pass through the photo-sensitive protective layer; etching the active material layer by using the photo-sensitive protective layer as a mask to form an active layer; removing the photo-sensitive protective layer under the first recess and the second recess to expose a first portion and a second portion of the active layer respectively; forming a first electrode connecting to the first portion; and forming a second electrode connecting to the second portion, wherein the first electrode is one of a source electrode and a drain electrode, and the second electrode is another one of the source electrode and the drain electrode.

An embodiment of the invention provides a thin film transistor substrate, which includes: a first substrate; a gate electrode disposed on the first substrate; a gate insulating layer disposed on the first substrate and covering the gate electrode; an active layer disposed on the gate insulating layer and located above the gate electrode; a photo-sensitive protective layer disposed on the active layer and exposing a first portion and a second portion of the active layer; a first electrode connecting to the first portion; and a second electrode connecting to the second portion.

An embodiment of the invention provides a display, which includes: the thin film transistor substrate described above; a second substrate opposite to the thin film transistor substrate; and a display medium disposed between the thin film transistor substrate and the second substrate.

An embodiment of the invention provides a manufacturing method of a thin film transistor substrate, which includes: providing a first substrate; forming a gate electrode on the first substrate; forming a gate insulating layer covering the gate electrode on the first substrate; forming an active material layer on the gate insulating layer; forming a photo-sensitive material layer on the active material layer; performing a photolithography process on the photo-sensitive material layer to pattern the photo-sensitive material layer so as to form a photo-sensitive protective layer, wherein the photo-sensitive protective layer is above the gate electrode; etching the active material layer by using the photo-sensitive protective layer as a mask to form an active layer, wherein a side wall of the active layer is recessed from a side wall of the photo-sensitive protective layer; removing the photo-sensitive protective layer; forming a first electrode connecting to a first portion of the active layer; and forming a second electrode connecting to a second portion of the active layer, wherein the first electrode is one of a source electrode and a drain electrode, and the second electrode is the other one of the source electrode and the drain electrode.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1A to FIG. 1F are cross-sectional views of a manufacturing process of a thin film transistor substrate according to an embodiment of the present invention;

FIGS. 2A to 2D are top views of FIGS. 1B to 1E, and FIGS. 1B to 1E are cross-sectional views of the structure along a sectional line I-I in FIGS. 2A to 2D;

FIG. 3A to FIG. 3F are cross-sectional views of a manufacturing process of a thin film transistor substrate according to another embodiment of the present invention;

FIGS. 4A to 4D are top views of FIGS. 3B to 3E, and FIGS. 3B to 3E are cross-sectional views of the structure along a sectional line I-I in FIGS. 4A to 4D; and FIG. 5 is a cross-sectional view of a display according to an embodiment of the present invention.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

FIG. 1A to FIG. 1F are cross-sectional views of a manufacturing process of a thin film transistor substrate according to an embodiment of the present invention. Firstly, referring to FIG. 1A, a first substrate 110 is provided, such as a glass substrate. Then, a gate electrode 120 and a gate insulating layer 130 covering the gate electrode 120 are formed on the first substrate 110. In one embodiment, the gate 120 may include aluminum (Al), molybdenum (Mo), or other suitable conductive materials. The gate insulating layer 130 includes, for example, silicon dioxide or other dielectric materials with high dielectric constants.

Then, an active material layer 140a is formed on the gate insulating layer 130. The active material layer 140a includes, for example, indium-gallium-zinc-oxide (IGZO) or other semiconductor materials suitable for serving as an active layer. Then, a photo-sensitive material layer 150a is formed on the active material layer 140a. The photo-sensitive material layer 150a includes, for example, a photo-sensitive organic-inorganic hybrid material, wherein the photo-sensitive organic-inorganic hybrid material may include siloxane and acrylic resin. As such, the photo-sensitive material layer 150a has photosensitive properties as well as improved chemical resistance because of the silicon content.

Figure 1B:
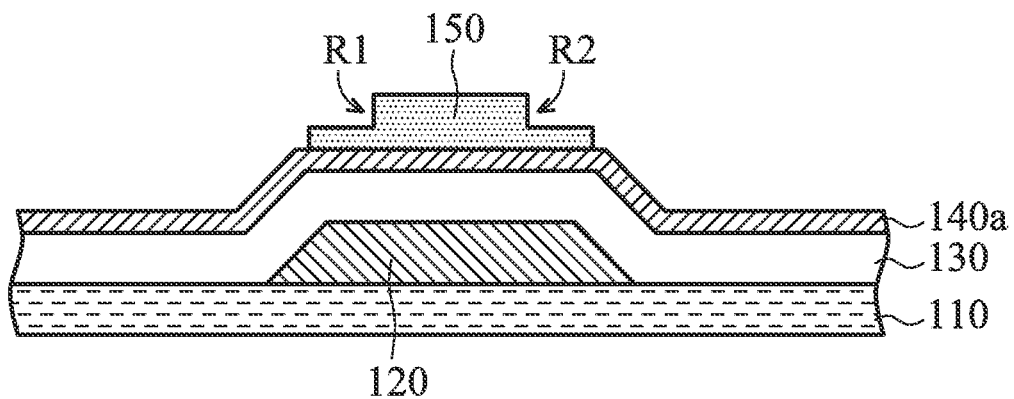

Then, referring to FIGS. 1A and 1B, a photolithography process is performed on the photo-sensitive material layer 150a by using a half tone mask M to pattern the photo-sensitive material layer 150a to form a photo-sensitive protective layer 150. The half tone mask M has an opaque region A1, a semitransparent region A2 (the light transmittance may be 1% to 99%), and a transparent region A3. The photo-sensitive protective layer 150 formed by the photolithography process is formed directly on the gate electrode 120 and has a first recess R1 and a second recess R2, wherein the first recess R1 and the second recess R2 both do not penetrate through the photo-sensitive protective layer 150. The first recess R1 and the second recess R2 correspond to the semitransparent region A2.

Figure 1C:
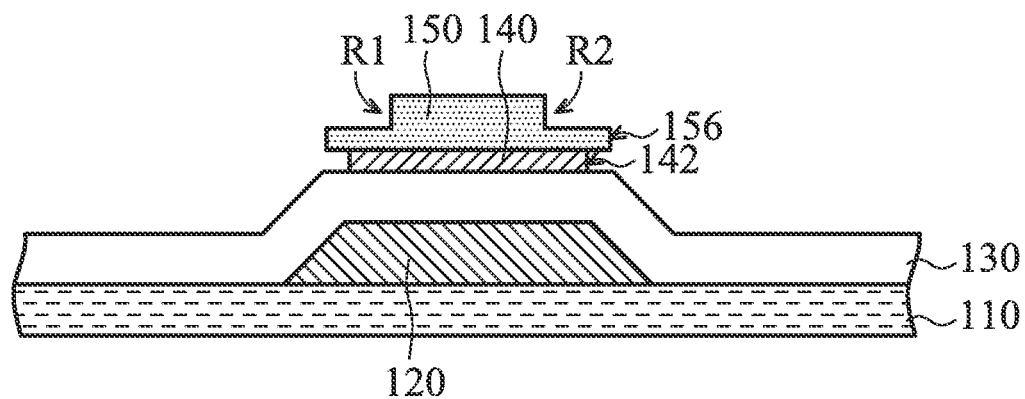
Figure 1D:
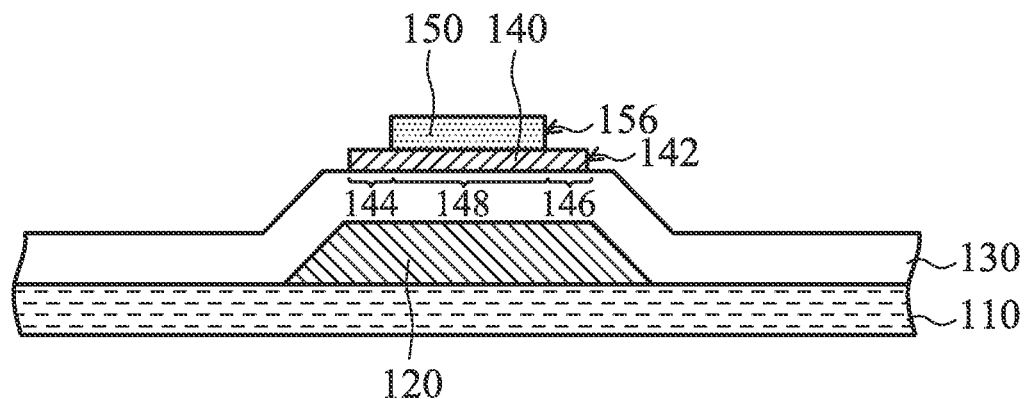
Figure 1E:
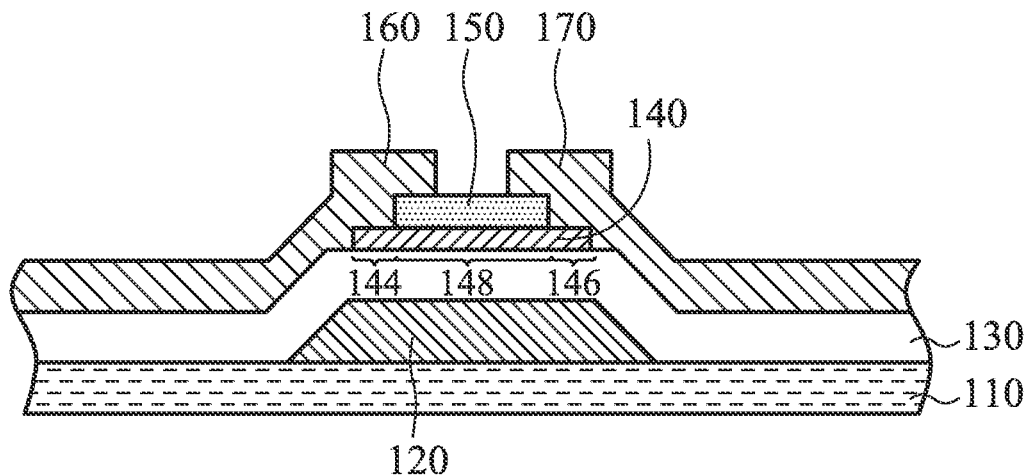
Figure 2A:
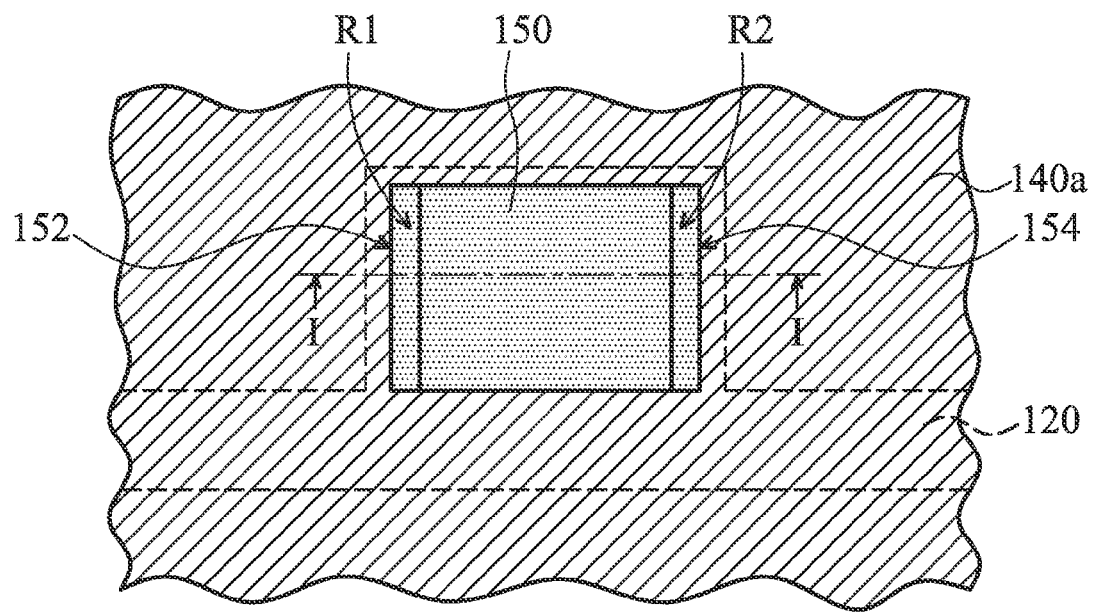

FIGS. 2A to 2D are top views of FIGS. 1B to 1E, and FIGS. 1B to 1E are cross-sectional views of the structure along a sectional line I-I in FIGS. 2A to 2D. Referring to FIGS. 1B and 2A, in one embodiment, the first recess R1 and the second recess R2 are adjacent to two opposite edges 152 and 154 of the photo-sensitive protective layer 150 respectively.

Figure 2B:
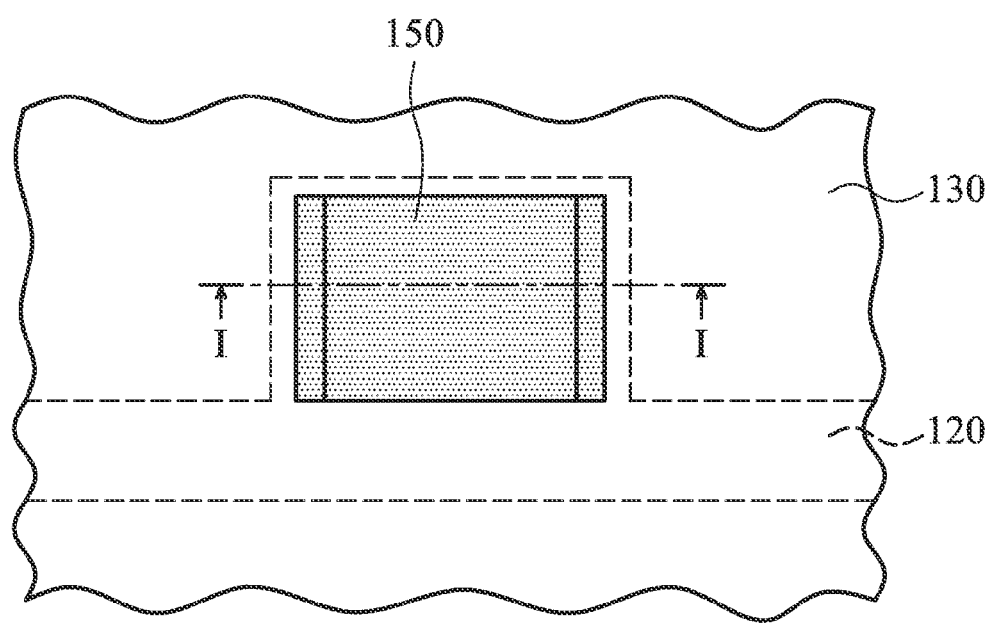

Then, referring to FIGS. 1C and 2B, the active material layer 140a is etched by using the photo-sensitive protective layer 150 as a mask to form an active layer 140. The etching of the active material layer 140a includes, for example, wet etching. In one embodiment, a side wall 142 of the active layer 140 is recessed from a side wall 156 of the photo-sensitive protective layer 150. Namely, an undercut structure is formed by the etch process.

Figure 2C:
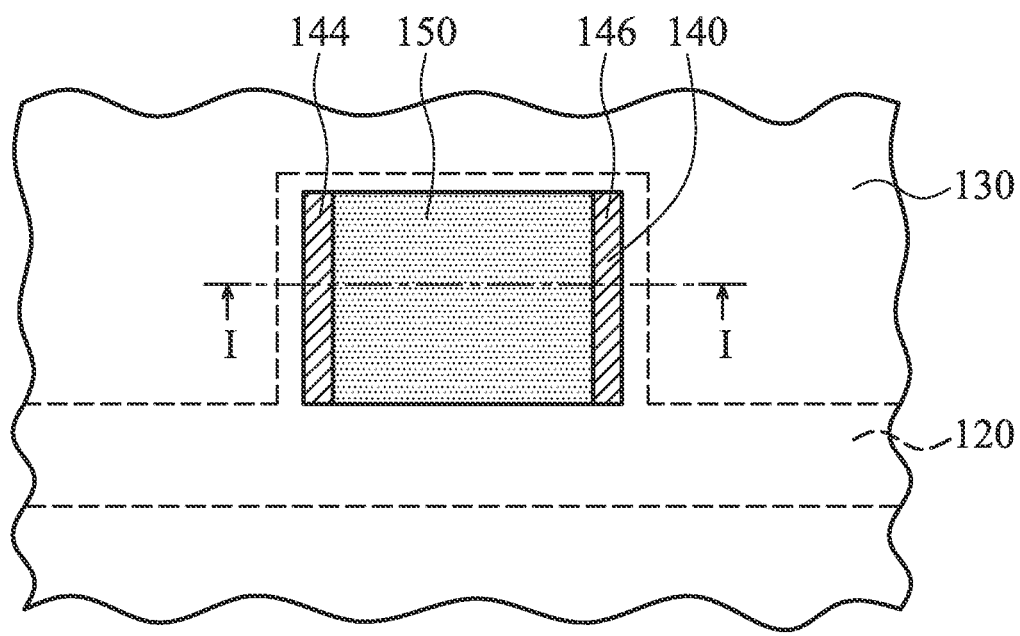

Then, referring to FIGS. 1D and 2C, a plasma ashing process may be optionally performed on the photo-sensitive protective layer 150 to remove the photo-sensitive protective layer 150 under the first recess R1 and the second recess R2 so as to expose a first portion 144 and a second portion 146 of the active layer 140 respectively. In this case, the side wall 142 of the active layer 140 extends beyond the side wall 156 of the photo-sensitive protective layer 150.

It should be noted that, when the active layer 140 includes an oxide semiconductor, an oxygen content of the active layer 140 is inversely proportional to an electrical conductivity of the active layer 140. Because the plasma ashing process may reduce the oxygen content of the first portion 144 and the second portion 146, the electrical conductivity of the first portion 144 and the second portion 146 is improved. Therefore, the electrical conductivity of the first portion 144 and the second portion 146 may be higher than that of a third portion 148 of the active layer 140 under the photo-sensitive protective layer 150.

Also, because the photo-sensitive protective layer 150 of the present embodiment has the first recess R1 and the second recess R2 not penetrating through the photo-sensitive protective layer 150, a portion of the active layer 140 may be exposed by removing the photo-sensitive protective layer 150 under the first recess R1 and the second recess R2. After removing the photo-sensitive protective layer 150 under the first recess R1 and the second recess R2, the side wall 142 of the active layer 140 may extend beyond the side wall 156 of the photo-sensitive protective layer 150 to eliminate the undercut structure (formed by etching the active material layer 140a by using the photo-sensitive protective layer 150 as a mask), which prevents poor contact between the active layer 140 and the source/drain regions subsequently formed thereon caused by the undercut.

Figure 2D:
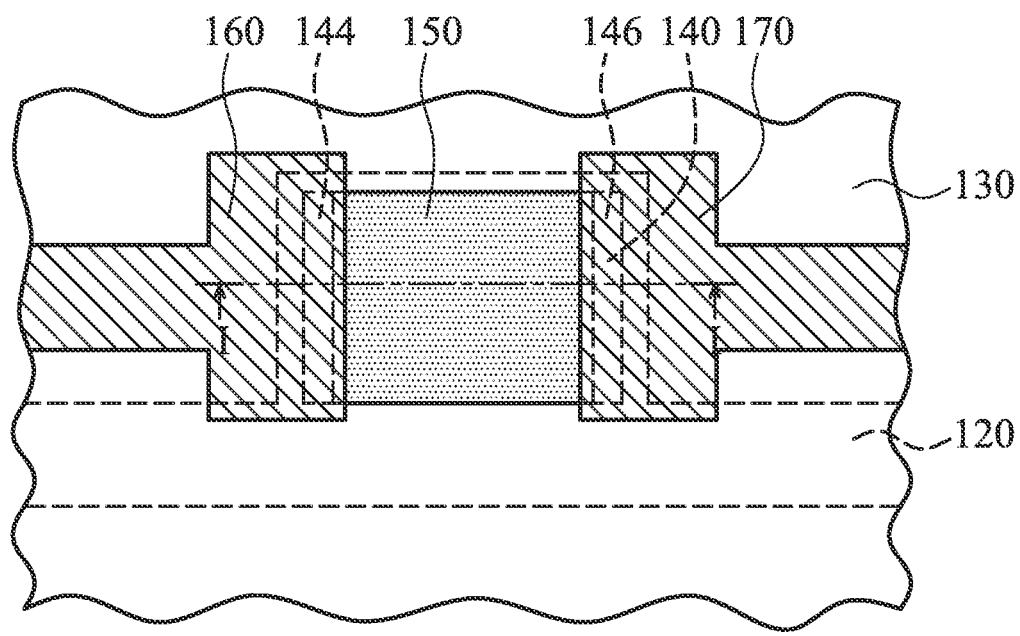

Then, referring to FIG. 1E and FIG. 2D, a conductive layer (not shown) is blanketly formed on the gate insulating layer 130 and is patterned by, for example, photolithography and etching to form a first electrode 160 and a second electrode 170 exposing a portion of the photo-sensitive protective layer 150. The first electrode 160 connects to the first portion 144, and the second electrode 170 connects to the second portion 146. The first electrode 160 and the second electrode 170 may serve as a source electrode and a drain electrode. In one embodiment, the first electrode 160 extends from the photo-sensitive protective layer 150 to the gate insulating layer 130 through the first portion 144, and the second electrode 170 extends from the photo-sensitive protective layer 150 to the gate insulating layer 130 through the second portion 146.

It should be noted that, in the present embodiment, because the first portion 144 and the second portion 146 of the active layer 140 have higher conductivities, the contact resistance between the electrodes (i.e., the first electrode 160 and the second electrode 170) and the active layer 140 may be effectively reduced.

Also, during formation of the first electrode 160 and the second electrode 170 by etching, the photo-sensitive protective layer 150 of the present embodiment may be used as an etching stop layer to protect the active layer 140 therebelow from etching process damage. Furthermore, removal of the photo-sensitive protective layer 150 is not necessary, which prevents damage of the active layer 140 below the photo-sensitive protective layer 150 from the photoresist stripper.

Figure 1F:
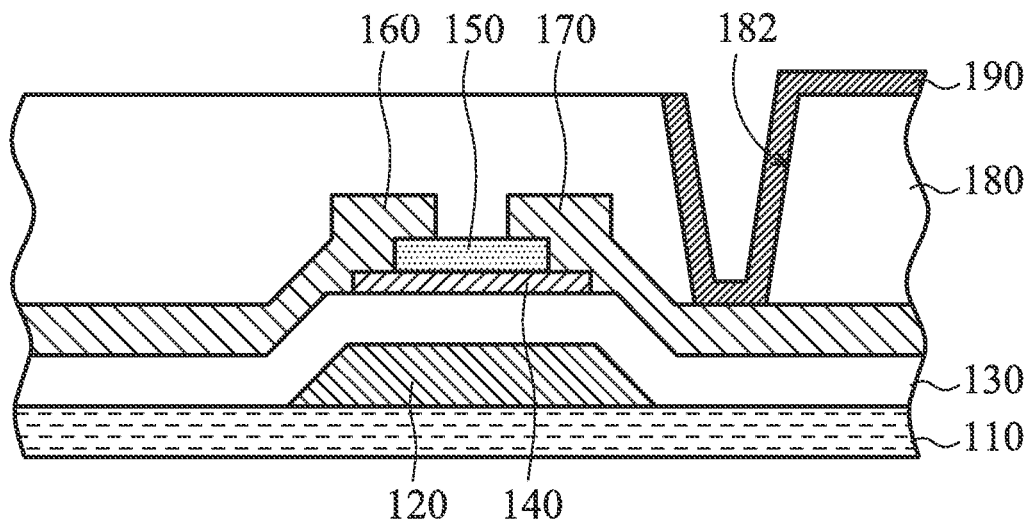

Then, referring to FIG. 1F, an insulating layer (not shown) is blanketly formed on the first substrate 110, and then is patterned to form a patterned insulating layer 180 having an opening 182 exposing the second electrode 170. Then, a conductive layer 190 is formed on the patterned insulating layer 180 and extends into the opening 182 to connect to the second electrode 170.

FIG. 3A to FIG. 3F are cross-sectional views of a manufacturing process of a thin film transistor substrate according to another embodiment of the present invention. It should be noted that, in the present embodiment, elements designed by the same reference numbers as those in FIGS. 1A to 1F have the structures and the materials similar thereto, and thus are not repeated herein.

Figure 3A:
Figure 3A:
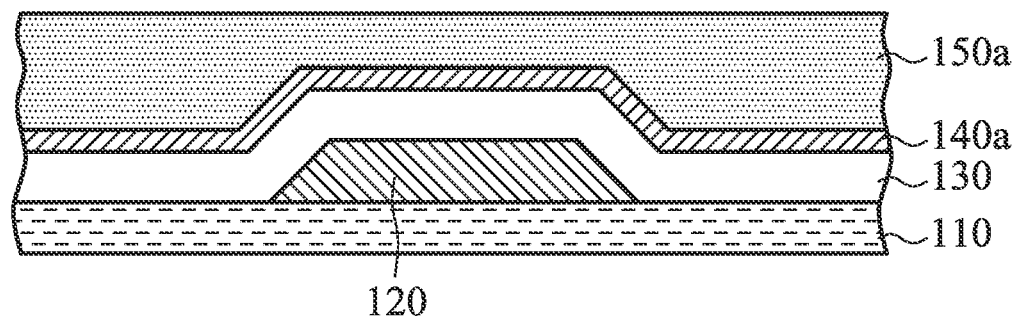

Firstly, referring to FIG. 3A, a first substrate 110 is provided. Then, a gate electrode 120 and a gate insulating layer 130 covering the gate electrode 120 are formed on the first substrate 110. Then, an active material layer 140a is formed on the gate insulating layer 130. Then, a photo-sensitive material layer 150a is formed on the active material layer 140a.

Figure 3B:
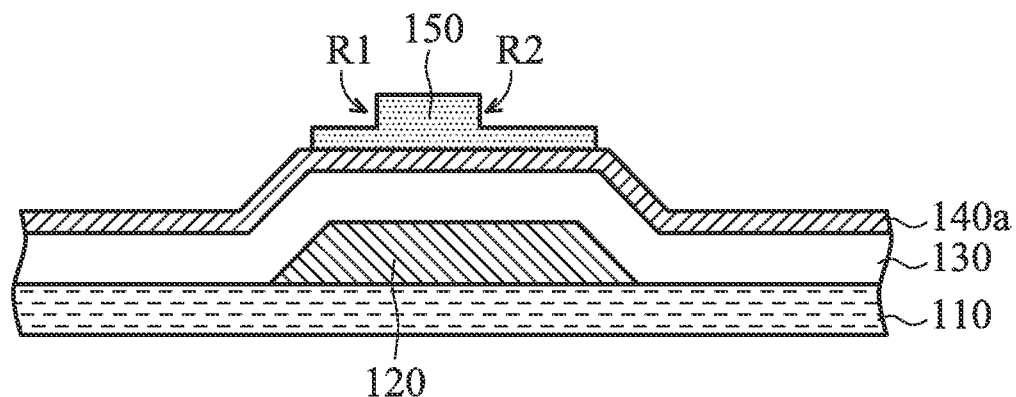

Then, referring to FIG. 3A and FIG. 3B, a photolithography process is performed on the photo-sensitive material layer 150a by using a half tone mask M to pattern the photo-sensitive material layer 150a to form a photo-sensitive protective layer 150. The half tone mask M has an opaque region A1, a semitransparent region A2 (the light transmittance may be 1% to 99%), and a transparent region A3. The photo-sensitive protective layer 150 formed by the photolithography process is directly on the gate electrode 120 and has a first recess R1 and a second recess R2, wherein the first recess R1 and the second recess R2 both do not penetrate through the photo-sensitive protective layer 150. The first recess R1 and the second recess R2 correspond to semitransparent regions A4 and A5 respectively.

Figure 3C:
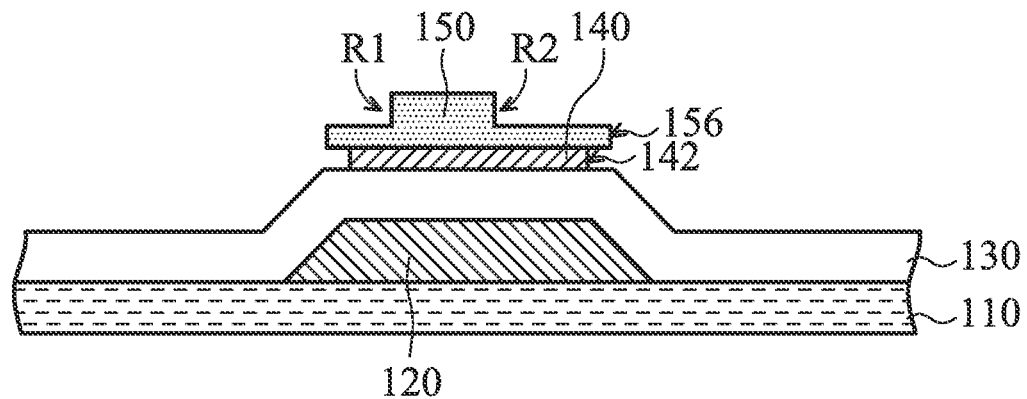
Figure 3D:
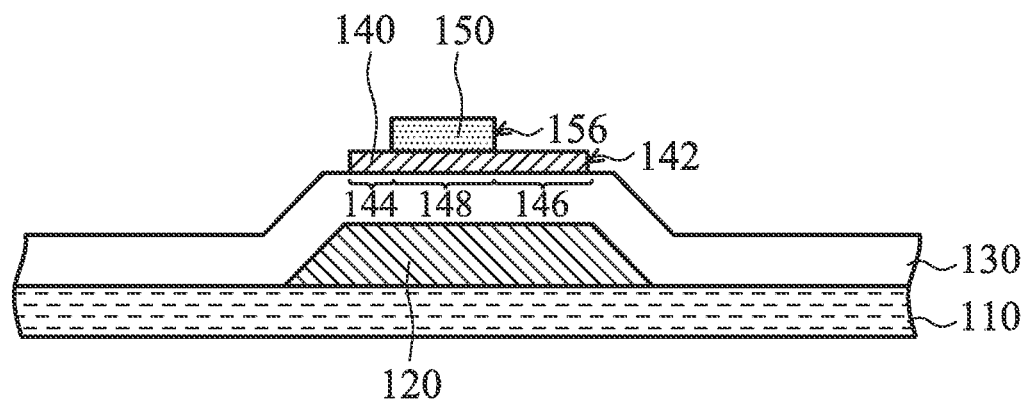
Figure 3E:
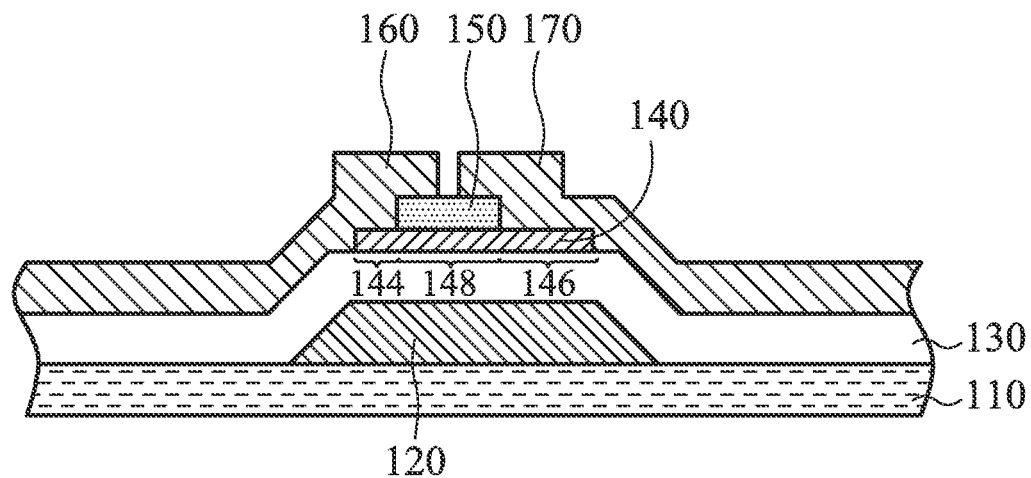
Figure 4A:
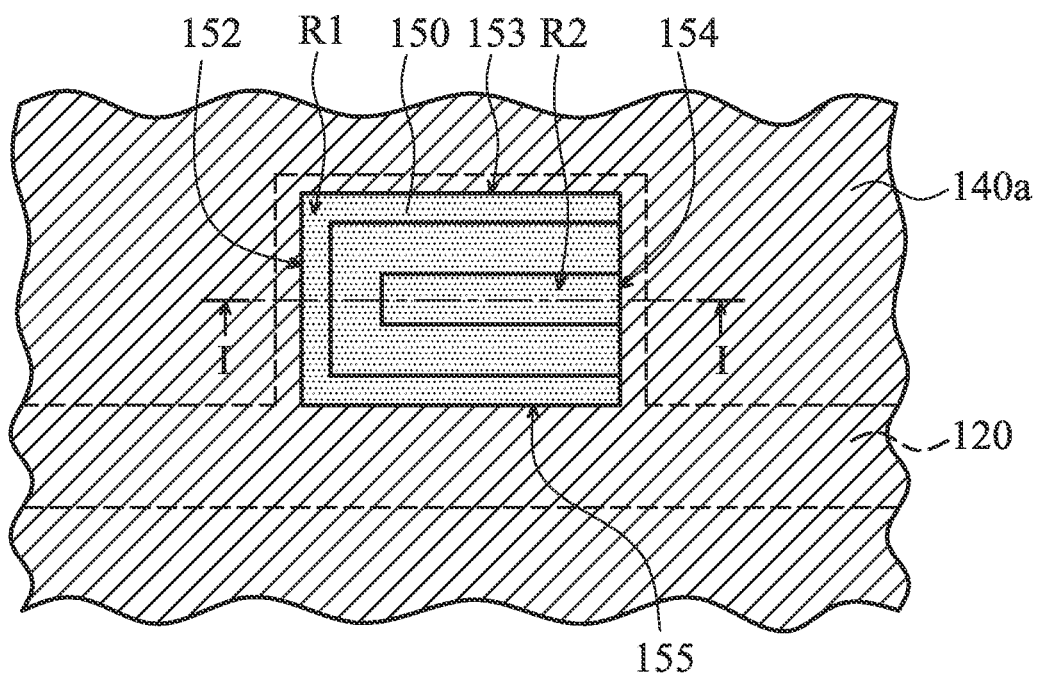

FIGS. 4A to 4D are top views of FIGS. 3B to 3E, and FIGS. 3B to 3E are cross-sectional views of the structure along a sectional line I-I in FIGS. 4A to 4D. Referring to FIG. 3B and FIG. 4A, in one embodiment, the first recess R1 is adjacent to edges 152, 153, and 155 of the photo-sensitive protective layer 150 and is substantially in a U-shape, and the second recess R2 extends from an edge 154 of the photo-sensitive protective layer 150 inward to an inner of the photo-sensitive protective layer 150, wherein the first recess R1 surrounds the second recess R2.

Figure 4B:
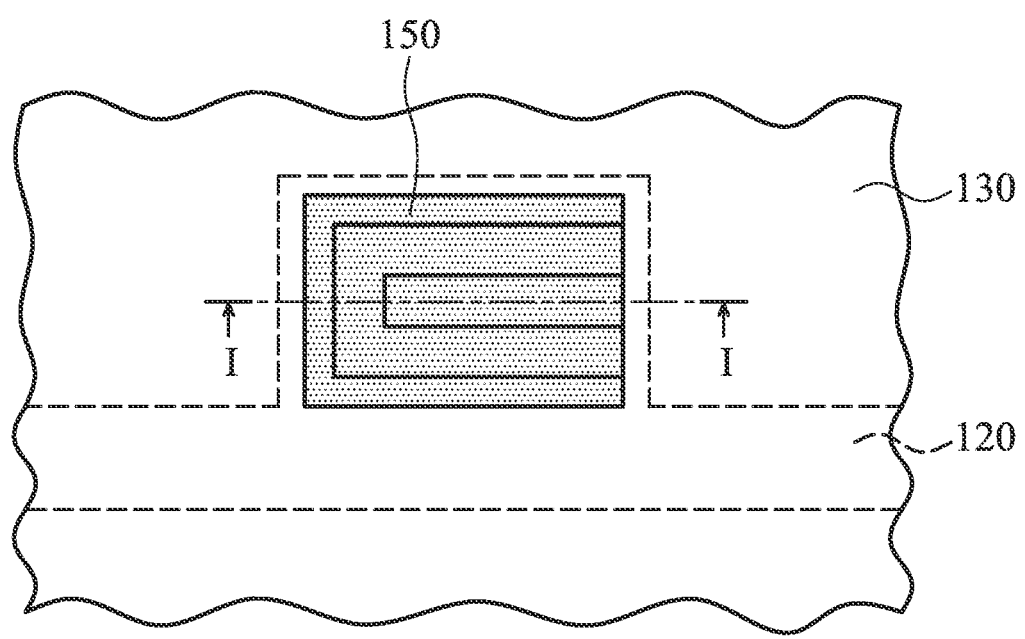

Then, referring to FIG. 3C and FIG. 4B, the active material layer 140a is etched by using the photo-sensitive protective layer 150 as a mask to form an active layer 140. The etching of the active material layer 140a includes, for example, wet etching. In one embodiment, a side wall 142 of the active layer 140 is recessed from a side wall 156 of the photo-sensitive protective layer 150. Namely, an undercut structure is formed by the etch process.

Figure 4C:
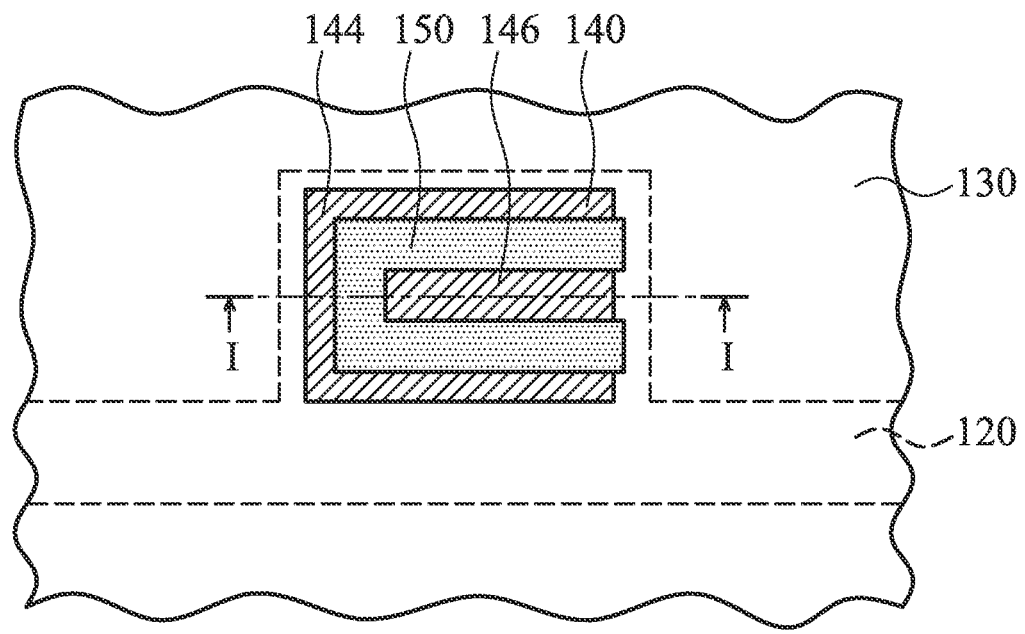

Then, referring to FIG. 3D and FIG. 4C, a plasma ashing process may be optionally performed on the photo-sensitive protective layer 150 to remove the photo-sensitive protective layer 150 under the first recess R1 and the second recess R2 so as to expose a first portion 144 and a second portion 146 of the active layer 140 respectively. In this case, the side wall 142 of the active layer 140 extends beyond the side wall 156 of the photo-sensitive protective layer 150.

Figure 4D:
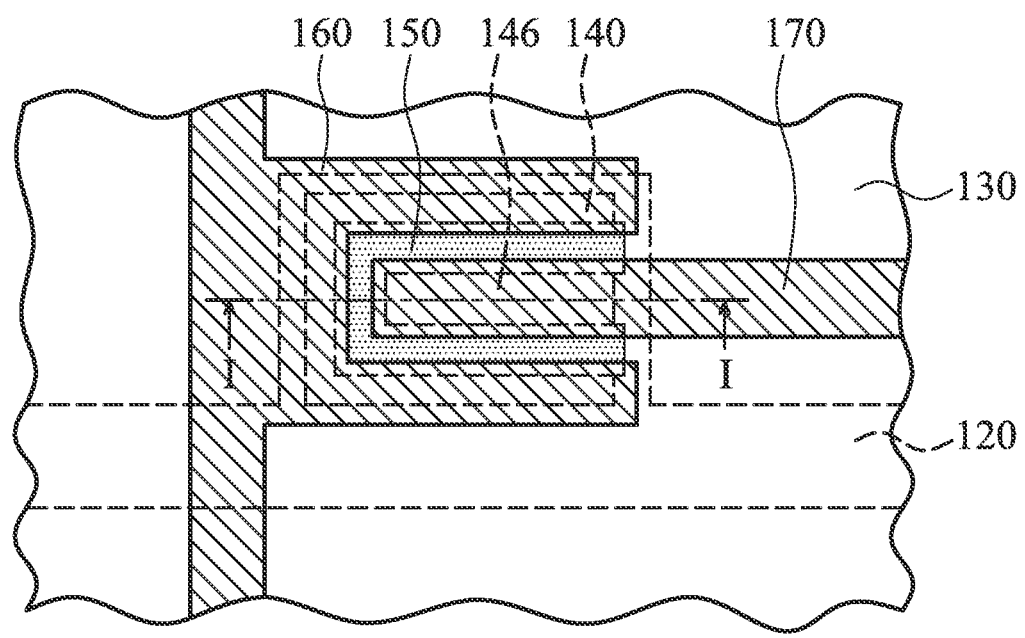

Then, referring to FIG. 3E and FIG. 4D, a conductive layer (not shown) is blanketly formed on the gate insulating layer 130 and is patterned to form a first electrode 160 and a second electrode 170 exposing a portion of the photo-sensitive protective layer 150. The first electrode 160 connects to the first portion 144, and the second electrode 170 connects to the second portion 146. The first electrode 160 and the second electrode 170 may be used as a source electrode and a drain electrode. In one embodiment, the first electrode 160 extends from the photo-sensitive protective layer 150 to the gate insulating layer 130 through the first portion 144, and the second electrode 170 extends from the photo-sensitive protective layer 150 to the gate insulating layer 130 through the second portion 146.

Figure 3F:
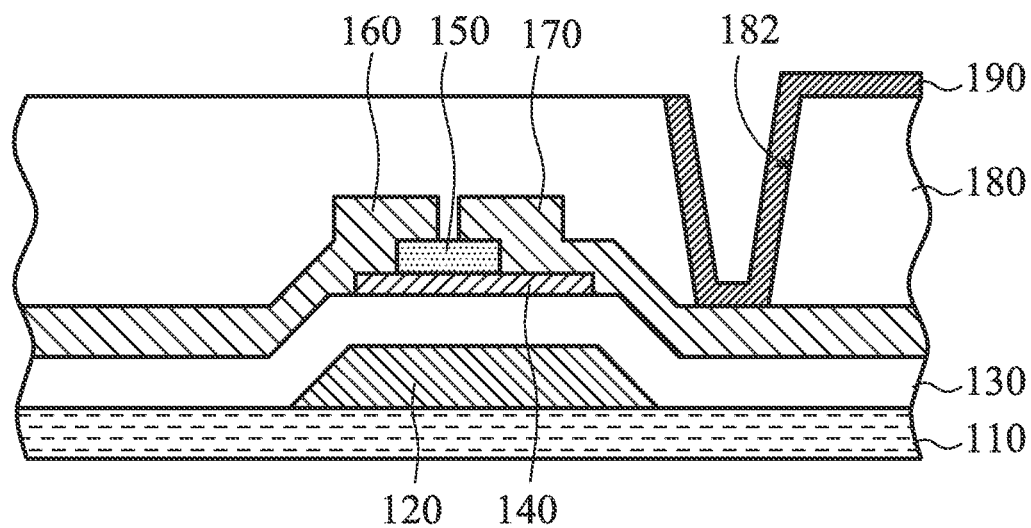

Then, referring to FIG. 3F, an insulating layer (not shown) is blanketly formed on the first substrate 110, and then is patterned to form a patterned insulating layer 180 having an opening 182 exposing the second electrode 170. Then, a conductive layer 190 is formed on the patterned insulating layer 180 and extends into the opening 182 to connect to the second electrode 170.

Figure 5:
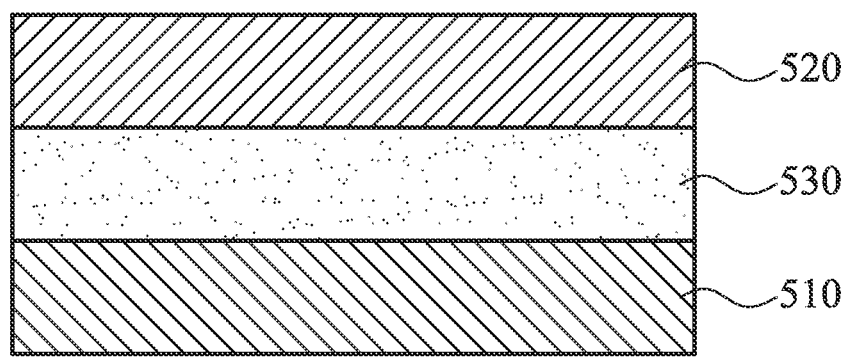

FIG. 5 is a cross-sectional view of a display according to an embodiment of the present invention. Referring to FIG. 5, a display 500 of the present embodiment includes a thin film transistor substrate 510, a second substrate 520, and a display medium 530 disposed between the thin film transistor substrate 510 and the second substrate 520. The thin film transistor substrate 510 may be the thin film transistor substrate shown in FIG. 1F or FIG. 3F, and the display medium 530 may be a liquid crystal layer or an organic light emitting layer. The second substrate 520 may be, for example, a color filter substrate or a transparent substrate.

In light of the foregoing, the present invention employs a photosensitive material to form the photo-sensitive protective layer, so a half tone mask may be used to perform a photolithography process to form the photo-sensitive protective layer with recesses. The photo-sensitive protective layer of the present invention can serve as an etching mask during etching the active material layer, and also can serve as an etching stop layer during formation of the source electrode and the drain electrode to protect the active layer therebelow. Also, the present invention may optionally use the plasma ashing process to remove the photo-sensitive protective layer under the recesses to expose a portion of the active layer, wherein the plasma ashing process may reduce the oxygen content of the exposed portion of the active layer so as to improve the electrical conductivity of the exposed portion, which reduces the contact resistance between the source electrode, the drain electrode, and the exposed portion.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A manufacturing method of a thin film transistor substrate, comprising:
   providing a first substrate;
   forming a gate electrode on the first substrate;
   forming a gate insulating layer covering the gate electrode on the first substrate;
   forming an active material layer on the gate insulating layer;
   forming a photo-sensitive material layer on the active material layer;
   performing a photolithography process on the photo-sensitive material layer to pattern the photo-sensitive material layer so as to form a photo-sensitive protective layer, wherein the photo-sensitive protective layer is above the gate electrode;
   etching the active material layer by using the photo-sensitive protective layer as a mask to form an active layer, wherein a side wall of the active layer is recessed from a side wall of the photo-sensitive protective layer;
   removing the photo-sensitive protective layer;

forming a first electrode connecting to a first portion of the active layer; and forming a second electrode connecting to a second portion of the active layer, wherein the first electrode is one of a source electrode and a drain electrode, and the second electrode is the other one of the source electrode and the drain electrode.

2. The manufacturing method of the thin film transistor substrate as claimed in claim 1, wherein the step of etching the active material layer includes wet etching.

3. The manufacturing method of the thin film transistor substrate as claimed in claim 1, wherein the active material layer includes indium-gallium-zinc-oxide (IGZO).

4. The manufacturing method of the thin film transistor substrate as claimed in claim 1, wherein the step of performing a photolithography process on the photo-sensitive material layer uses a half tone mask.

5. The manufacturing method of the thin film transistor substrate as claimed in claim 4, wherein the photo-sensitive protective layer has a first recess and a second recess which do not pass through the photo-sensitive protective layer.

6. The manufacturing method of the thin film transistor substrate as claimed in claim 5, wherein the step of removing the photo-sensitive protective layer includes removing the photo-sensitive protective layer under the first recess and the second recess to expose the first portion and the second portion of the active layer respectively.

7. The manufacturing method of the thin film transistor substrate as claimed in claim 6, wherein the step of removing the photo-sensitive protective layer under the first recess and the second recess comprises:

performing a plasma ashing process on the photo-sensitive protective layer.

8. The manufacturing method of the thin film transistor substrate as claimed in claim 5, wherein the first recess and the second recess are adjacent to two opposite edges of the photo-sensitive protective layer respectively.

9. The manufacturing method of the thin film transistor substrate as claimed in claim 1, wherein the first electrode extends from the photo-sensitive protective layer to the gate insulating layer through the first portion, and the second electrode extends from the photo-sensitive protective layer to the gate insulating layer through the second portion.

10. The manufacturing method of the thin film transistor substrate as claimed in claim 1, wherein the step of forming the first electrode and the second electrode comprises:

forming a conductive layer on an entirety of the gate insulating layer; and patterning the conductive layer to expose a portion of the photo-sensitive protective layer so as to form the first electrode and the second electrode.

11. The manufacturing method of the thin film transistor substrate as claimed in claim 1, wherein the photo-sensitive protective layer comprises a photo-sensitive organic-inorganic hybrid material.

12. The manufacturing method of the thin film transistor substrate as claimed in claim 11, wherein the photo-sensitive organic-inorganic hybrid material comprises siloxane.

13. The manufacturing method of the thin film transistor substrate as claimed in claim 5, wherein the first recess is adjacent to a first edge of the photo-sensitive protective layer and is substantially in a U-shape, and the second recess extends from a second edge of the photo-sensitive protective layer inwardly to an inner of the photo-sensitive protective layer, wherein the first recess surrounds the second recess.

14. The manufacturing method of the thin film transistor substrate as claimed in claim 5, wherein a side wall of the active layer is recessed from a side wall of the photo-sensitive protective layer before removing the photo-sensitive protective layer under the first recess and the second recess.

15. The manufacturing method of the thin film transistor substrate as claimed in claim 5, wherein a side wall of the active layer extends beyond a side wall of the photo-sensitive protective layer after removing the photo-sensitive protective layer under the first recess and the second recess.

* * * * *